US010304501B1

(12) United States Patent
Pardeik et al.

(10) Patent No.: US 10,304,501 B1
(45) Date of Patent: May 28, 2019

(54) IMPLEMENTING DRAM REFRESH POWER OPTIMIZATION DURING LONG IDLE MODE

(71) Applicant: International Business Machines Corporation, Armonk, NY (US)

(72) Inventors: Michael D. Pardeik, Rochester, MN (US); Edgar R. Cordero, Round Rock, TX (US); Arindam Raychaudhuri, Kodihalli (IN); Diyanesh B. Chinnakkonda Vidyapoornachary, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/848,789

(22) Filed: Dec. 20, 2017

(51) Int. Cl.
| | |
|---|---|
| *G11C 7/00* | (2006.01) |
| *G11C 11/406* | (2006.01) |
| *G06F 1/3234* | (2019.01) |
| *G06F 13/18* | (2006.01) |

(52) U.S. Cl.
CPC ............ *G11C 7/00* (2013.01); *G06F 1/3275* (2013.01); *G11C 11/406* (2013.01); *G06F 13/18* (2013.01); *G11C 2207/2227* (2013.01); *G11C 2211/4065* (2013.01); *G11C 2211/4067* (2013.01)

(58) Field of Classification Search
CPC .......... G11C 11/406; G11C 2211/4065; G11C 2211/4067; G11C 2207/2227; G06F 1/3275
See application file for complete search history.

(56) References Cited

U.S. PATENT DOCUMENTS

| | | | | |
|---|---|---|---|---|
| 5,873,114 | A | * 2/1999 | Rahman | ............... G06F 13/1636 365/222 |
| 2011/0296097 | A1 | 12/2011 | Elnozahy et al. | |
| 2011/0296214 | A1 | * 12/2011 | Arntzen | ................ G06F 1/3203 713/320 |
| 2013/0135941 | A1 | * 5/2013 | Reohr | .................... G11C 11/406 365/189.02 |
| 2015/0149717 | A1 | 5/2015 | Riho | |
| 2017/0169881 | A1 | * 6/2017 | Cox | .................. G11C 11/40611 |
| 2017/0278561 | A1 | 9/2017 | Oh et al. | |

* cited by examiner

*Primary Examiner* — Ajay Ojha
(74) *Attorney, Agent, or Firm* — Joan Pennington

(57) ABSTRACT

A method, system and memory controller are provided for implementing refresh power optimization during long idle mode in a memory subsystem utilizing Dynamic Random Access Memory (DRAM). The DRAM includes DRAM cells requiring periodic refresh. A DRAM activity monitoring mechanism monitors an instruction queue and asserts a predefined mode register bit when the instruction queue is empty. Responsive to the asserted predefined mode register bit, a refresh rate is increased and a low power mode is established by reducing DRAM core power level for optimizing refresh power during the long idle mode to provide enhanced system performance.

18 Claims, 10 Drawing Sheets

700

SIMULATION DATA OF DRAM CORE (UNIT DRAM CELL) POWER REDUCTION OF
EXAMPLE DRAM ARRAY MODEL WITH DRAM CORE SUPPLY AND REFRESH RATE

| VOLTAGE (V)/ REFRESH RATE, (KHz) | 128.2 Iavg (nA) | (x1) | 256.4 Iavg (nA) | (x2) | 515.5 Iavg (nA) | (x4) | 1041.7 Iavg (nA) | (x8) |
|---|---|---|---|---|---|---|---|---|
| 1.25 | 592 | -- | 726 | -- | 873 | -- | 985 | -- |
| 1.2 | 567 | -4.2 | 693 | -4.5 | 832 | -4.7 | 937 | -4.9 |
| 1.15 | 545 | -7.9 | 665 | -8.4 | 795 | -8.9 | 892 | -9.4 |
| 1.1 | 525 | -11.3 | 638 | -12.1 | 761 | -12.8 | 852 | -13.5 |
| 1.05 | 506 | -14.5 | 613 | -15.6 | 728 | -16.6 | 813 | -17.5 |
| 0.9 | 450 | -24.0 | 539 | -25.8 | 634 | -27.4 | 705 | -28.4 |
| 0.8 | 413 | -30.2 | 490 | -32.5 | 573 | -34.4 | 634 | -35.6 |
| 0.6 | 339 | -42.7 | 392 | -46.0 | 450 | -48.5 | 493 | -49.9 |

| TEST CHARACTERIZATION DATA OF 16GB DDR4 DRAM DIMM POWER WITH DRAM CORE SUPPLY AND REFRESH RATE ||||||||
|---|---|---|---|---|---|---|---|
| BASELINE VALUES ||||||||
| REFRESH INTERVAL (us) | 7.8 | 3.9 | 1.94 | 0.96 | | REFRESH INTERVAL (LINEAR) ESTIMATE AT BASELINE POWER (US) | |
| REFRESH FREQUENCY (kHz) | 128.21 | 256.41 | 515.46 | 1041.67 | VRM VOLTAGE % FROM 1.25V VRM BASELINE | | REFRESH INTERVAL ESTIMATE % FROM 7.8us BASELINE |
| VRM VOLTAGE (V) | 1X REF DIMM POWER (W) | 2X REF DIMM POWER (W) | 4X REF DIMM POWER (W) | 8X REF DIMM POWER (W) | | | |
| 1.25 | 1.0187 | 1.1954 | 1.5518 | 2.2720 | 0.0% | 7.80 | 0.0% |
| 1.20 | 0.9381 | 1.1075 | 1.4479 | 2.1348 | -4.0% | 5.95 | -23.8% |
| 1.15 | 0.8617 | 1.0227 | 1.3470 | 2.0010 | -8.0% | 4.00 | -48.7% |
| 1.10 | 0.7883 | 0.9409 | 1.2490 | 1.8712 | -12.0% | 3.41 | -56.3% |
| 1.05 | 0.7178 | 0.8620 | 1.1517 | 1.7380 | -16.0% | 2.84 | -63.6% |
| 1.00 | 0.6504 | 0.7845 | 1.0525 | 1.5911 | -20.0% | 2.19 | -72.0% |
| 0.90 | 0.4328 | 0.4325 | 0.4317 | 0.4305 | -28.0% | | |
| 0.80 | 0.3304 | 0.3302 | 0.3297 | 0.3313 | -36.0% | | |
| 0.70 | 0.2195 | 0.2000 | 0.2281 | 0.2270 | -44.0% | | |
| 0.60 | 0.1192 | 0.1192 | 0.1193 | 0.1215 | -52.0% | | |
| 0.50 | 0.0611 | 0.0609 | 0.0629 | 0.0609 | -60.0% | | |
| 0.40 | 0.0011 | 0.0012 | 0.0012 | 0.0012 | -68.0% | | |

| TEST CHARACTERIZATION DATA OF 32GB DDR4 DRAM DIMM POWER WITH DRAM CORE SUPPLY AND REFRESH RATE | | | | | | | |
|---|---|---|---|---|---|---|---|
| BASELINE VALUES | | | | | | | |
| REFRESH INTERVAL (us) | 7.8 | 3.9 | 1.94 | 0.96 | | | |
| REFRESH FREQUENCY (kHz) | 128.21 | 256.41 | 515.46 | 1041.67 | | REFRESH INTERVAL (LINEAR) ESTIMATE AT BASELINE POWER (US) | REFRESH INTERVAL ESTIMATE % FROM 7.8us BASELINE |
| VRM VOLTAGE (V) | 1X REF DIMM POWER (W) | 2X REF DIMM POWER (W) | 4X REF DIMM POWER (W) | 8X REF DIMM POWER (W) | VRM VOLTAGE % FROM 1.25V VRM BASELINE | | |
| 1.25 | 1.5363 | 1.8868 | 2.5886 | 3.9942 | 0.0% | 7.80 | 0.0% |
| 1.20 | 1.4188 | 1.7514 | 2.4209 | 3.7601 | -4.0% | 6.40 | -18.0% |
| 1.15 | 1.3041 | 1.6218 | 2.2594 | 3.5378 | -8.0% | 4.93 | -36.9% |
| 1.10 | 1.1947 | 1.4965 | 2.1017 | 3.3133 | -12.0% | 3.76 | -51.7% |
| 1.05 | 1.0880 | 1.3714 | 1.9398 | 3.0680 | -16.0% | 3.32 | -57.4% |
| 1.00 | 0.9843 | 1.2470 | 1.7702 | 2.8074 | -20.0% | 2.81 | -64.0% |
| 0.90 | 0.5982 | 0.5970 | 0.5953 | 0.5919 | -28.0% | | |
| 0.80 | 0.4504 | 0.4511 | 0.4477 | 0.4499 | -36.0% | | |
| 0.70 | 0.2900 | 0.3146 | 0.3219 | 0.2901 | -44.0% | | |
| 0.60 | 0.1670 | 0.1669 | 0.1670 | 0.1672 | -52.0% | | |
| 0.50 | 0.0630 | 0.0633 | 0.0633 | 0.0634 | -60.0% | | |
| 0.40 | 0.0023 | 0.0023 | 0.0024 | 0.0024 | -68.0% | | |

FIG. 9

IMPLEMENTING DRAM REFRESH POWER OPTIMIZATION DURING LONG IDLE MODE

FIELD OF THE INVENTION

The present invention relates generally to the data processing field, and more particularly, relates to a method, system and memory controller for implementing refresh power optimization during long idle mode in a memory subsystem utilizing Dynamic Random Access Memory (DRAM) to provide enhanced system performance.

DESCRIPTION OF THE RELATED ART

Today's need for main memory capacity and bandwidth are increasing with multi-core increasing a number of cores and agents. Data-intensive applications have increased demand for data with consolidation of cloud computing, graphics processing units (GPUs), and mobile devices.

Main memory energy and power present a key design challenge. DRAM consumes power even when not in use from periodic refresh and approximately 40-50% energy spent in off-chip memory hierarchy. DRAM technology will not scale easily below 40-35 nm going forward. Also DRAM capacity, cost, and energy and power are hard to scale.

DRAM cell capacitor charge leaks over time due to temperature, manufacturing issue requiring periodic refresh, for example, every 64 ms to restore lost charge to maintain data. Downside of DRAM refresh include energy consumption with each refresh consuming energy. Performance degradation results with DRAM rank and bank being unavailable while refreshed and predictability impact of long pause during refresh. The DRAM refresh rate limits DRAM capacity scaling. During long idle mode, periodic refresh consumes significant energy, thereby impacts overall battery life expectations of portable mobile systems.

A need exists for an effective mechanism to enable refresh power optimization during long idle mode in a memory subsystem utilizing Dynamic Random Access Memory (DRAM) and provide enhanced system performance.

SUMMARY OF THE INVENTION

Principal aspects of the present invention are to provide a method, system and memory controller for implementing refresh power optimization during long idle mode in a memory subsystem utilizing Dynamic Random Access Memory (DRAM). Other important aspects of the present invention are to provide such method, system and memory controller and DRAM configuration substantially without negative effects and that overcome some of the disadvantages of prior art arrangements.

In brief, a method, system and memory controller are provided for implementing refresh power optimization during long idle mode in a memory subsystem utilizing Dynamic Random Access Memory (DRAM). The DRAM includes DRAM cells requiring periodic refresh. A DRAM activity monitoring mechanism monitors an instruction queue and asserts a predefined mode register bit when the instruction queue is empty. Responsive to the asserted predefined mode register bit, a refresh rate is increased and a low power mode is established by reducing DRAM core power level for optimizing refresh power during the long idle mode to provide enhanced system performance.

In accordance with features of the invention, the memory controller sends the DRAM at least one mode register set (MRS) command when the instruction queue is empty. Based on the assertion state of predefined mode register bit called LONG_IDLE, a refresh control module inside DRAM enhances the refresh rate for example, to two times (2×) a normal refresh rate in order to enhance charge retention capability of DRAM array cells at lower core supply.

In accordance with features of the invention, a DRAM power management actuates low power mode by reducing DRAM core power level (Vcc), for example, by 50% or (Vcc/2) level. The DRAM power management and refresh control module monitors continuously the DRAM idle state or status of the LONG_IDLE mode register bit. Once DRAM exits the idle state, de-asserting LONG_IDLE mode register bit by the memory controller, the DRAM core power supply level is restored back to normal power supply level (Vcc) and then refresh rate is restored back to normal (1×) level.

BRIEF DESCRIPTION OF THE DRAWINGS

The present invention together with the above and other objects and advantages may best be understood from the following detailed description of the preferred embodiments of the invention illustrated in the drawings, wherein:

FIGS. 7, 8 and 9 are diagrams illustrating respective example simulation and test characterization data including voltage and refresh rate values in the memory subsystem of FIGS. 1 and 4 in accordance with preferred embodiments.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and memory controller are provided for implementing refresh power optimization during long idle mode in Dynamic Random Access Memory (DRAM).

Figure 1:
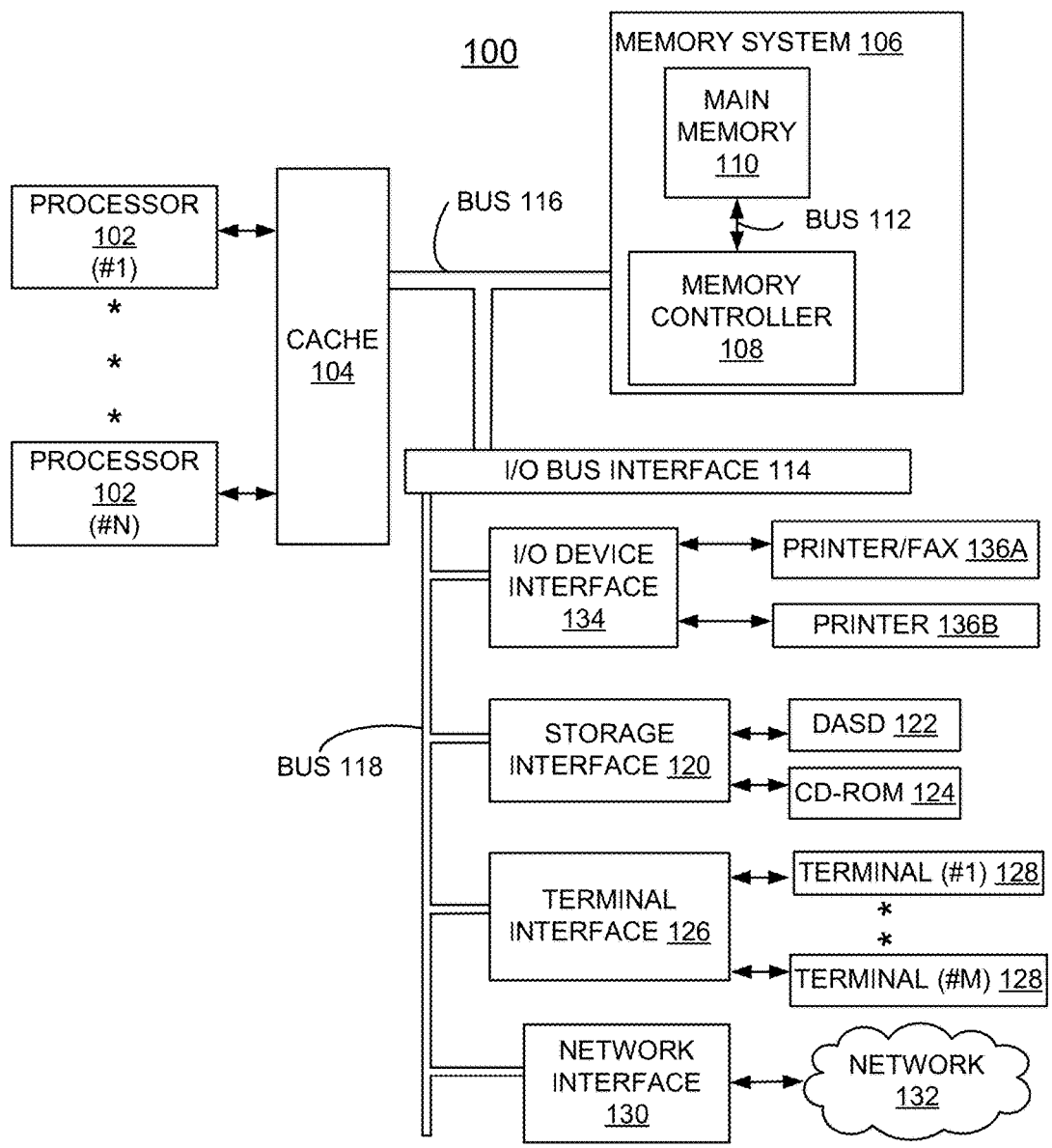
FIG. 1 illustrates an example computer system for implementing refresh power optimization during long idle mode in a memory subsystem utilizing Dynamic Random Access Memory (DRAM) in accordance with preferred embodiments.

Having reference now to the drawings, in FIG. 1, there is shown an example computer system generally designated by the reference character 100 for implementing refresh power optimization during long idle mode in Dynamic Random Access Memory (DRAM) in accordance with the preferred embodiment. Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a memory system 106 including a memory controller 108 and a main memory 110 connected by a bus 112. Bus 112 is one or more busses that send address/command information to main memory 110 and send and receive data from the memory 110. Main memory 110 is a random-access semiconductor memory for storing data, including programs. Main memory 110 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, memory controller 108 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, and a I/O device interface 134 coupled to I/O devices, such as a first printer/fax 136A, and a second printer 136B.

I/O bus interface 114 communicates with multiple I/O interface units 120, 126, 130, and 134, which are also known as I/O processors (IOPs) or I/O adapters (IOAs), through system I/O bus 116. System I/O bus 116 is, for example, an industry standard PCI bus, or other appropriate bus technology.

Computer system 100 is shown in simplified form sufficient for understanding the present invention. The illustrated computer system 100 is not intended to imply architectural or functional limitations. Although main memory 110 of main memory system 106 is represented conceptually in FIG. 1 as a single entity, it will be understood that in fact the main memory is more complex. In particular, main memory system 106 comprises multiple modules and components. The present invention can be used with various hardware implementations and systems and various other internal hardware devices.

Figure 4:
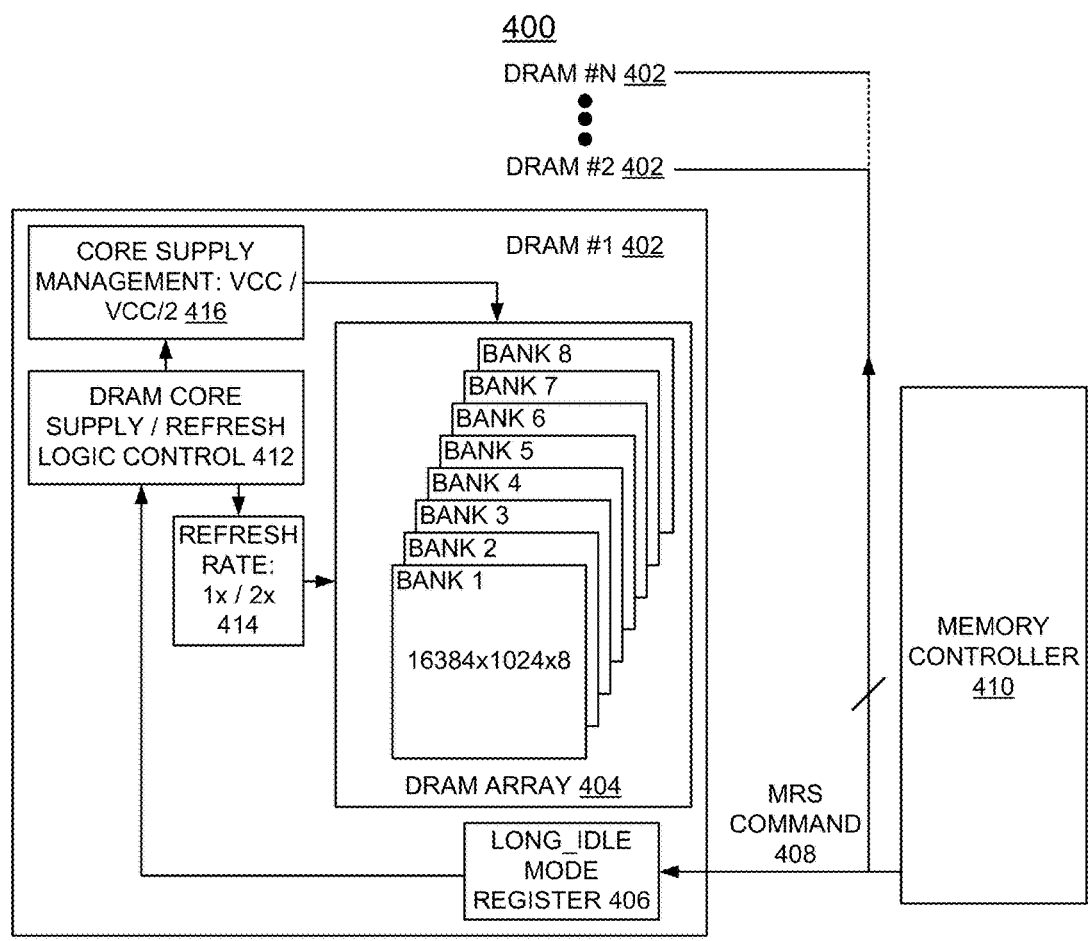
FIG. 4 illustrates an example memory subsystem for implementing refresh power optimization during long idle mode in Dynamic Random Access Memory (DRAM) in accordance with preferred embodiments.

An example memory subsystem, for example, of the main memory system 106 is illustrated and described with respect to FIG. 4 for implementing refresh power optimization during long idle mode in Dynamic Random Access Memory (DRAM) in accordance with preferred embodiments.

Figure 2:
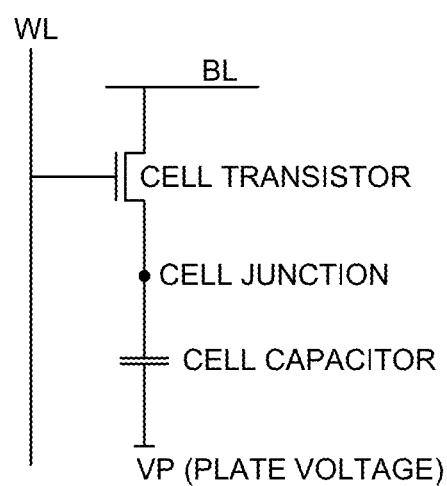
FIGS. 2 and 3 illustrates example DRAM cell refresh management in accordance with preferred embodiments.
Figure 3:
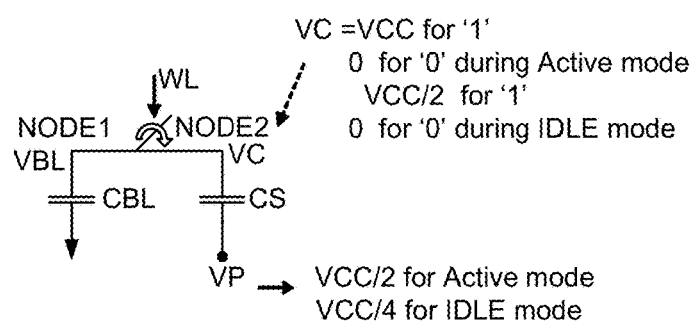

Referring now to FIGS. 2 and 3, there are shown DRAM cells illustrating example refresh management for implementing refresh power optimization during long idle mode in Dynamic Random Access Memory (DRAM) in accordance with preferred embodiments. In FIG. 2, there is shown a DRAM cell transistor generally designated by the reference character 200 connected between a bit line (BL) and a cell junction to a cell capacitor connected to voltage signal, Vp (also known as plate voltage of the DRAM cell capacitor) with a word line (WL) gate input.

In FIGS. 2 and 3, during an active period of the DRAM during sensing, when a DRAM cell is connected to bit line (BL), it loses majority of its charge from Vcc to (Vcc/2+Vs) when storing '1' due to charge sharing with large bit line capacitor $C_{BL}$, or it is charged up from 0 to (Vcc/2−Vs) when storing '0' where Vs=(Vcc/2)/(1+$C_{BL}$/Cs). When write back happens during refresh, DRAM cell storing '1' needs to be recharged back to Vcc level from (Vcc/2+Vs). This is the primary reason for consuming power during refresh. Similarly, the /BL (complimentary bit line signal) also charges up from (Vcc/2−Vs) to Vcc and Cs will be discharged from (Vcc/2−Vs) to 0 when storing '0' during write back. As a result refresh power is mostly accounted for DRAM cells storing '1' due to re-charging of cells from (Vcc/2+Vs) to Vcc back again and charging/BL capacitor $C_{BL\ from}$ (Vcc/2−Vs) to Vcc level. For stored data '1', refresh power consumed, P1=0.5*Cs*sqr(Vcc/2−Vs)*f and for stored data '0', and refresh power, P2=0.5*$C_{BL}$*sqr(Vcc/2+vs)*f where f=refresh rate. Total refresh power, P=P1+P2. This indicates refresh power can be reduced significantly when Vcc is reduced Referring to FIG. 3, example DRAM cell refresh management is illustrated during long idle mode in accordance with preferred embodiments together with during active mode. During, long IDLE mode in accordance with preferred embodiments includes increase refresh rate, for example to 2× as shown. The DRAM cell core supply is decreased, for example, from Vcc to Vcc/2 and the DRAM cell plate voltage is reduced from Vcc/2 to Vcc/4. For storing logic '1', the charge in DRAM cell is Cs*Vcc/4 and for storing '0' charge is—Cs*Vcc/4 during IDLE mode. For sensing/write back during refresh, the precharge level for bitline is Vcc/4 and during write back DRAM cell capacitor upper voltage Vc would be either Vcc/2 (for strong '1') or 0 (for storing '0').

Referring to FIG. 3, during long idle mode example charge stored in DRAM cell is (Cs*Vcc/4) for storing '1' and (−Cs*Vcc/4) for storing '0'. Refresh Power, P'=P1'+P2' where P1'=0.5*Cs*sqr(Vcc/4−Vs)*2f or ~0.5*Cs*sqr(Vcc/4)*2f. P2'=0.5*$C_{BL}$*sqr(Vcc/4+vs)*2f or ~0.5*$C_{BL}$*sqr(Vcc/4)*2f. Thus, P'=P/2→~50% power saving (for large $C_{BL}$, Vs is negligible.

Referring to FIG. 4, there is shown a high level block diagram illustrating example memory subsystem generally designated by the reference character 400 in the memory system 106 for implementing refresh power optimization during long idle mode in Dynamic Random Access Memory (DRAM) in accordance with the preferred embodiments.

In accordance with features of the invention, the memory subsystem 400 with the Dynamic Random Access Memory (DRAM) #1-#N, 402 with each DRAM including a DRAM array 404 of a plurality of Banks 1-8, as shown. Memory subsystem 400 includes a LONG_IDLE mode register 406 receiving a mode register set (MRS) command 408 applied to the LONG_IDLE mode register 406 by a memory controller 410.

In accordance with features of the invention, the memory subsystem 400 includes DRAM core supply and refresh logic control 412 coupled to the LONG_IDLE mode register 406 receiving a predefined mode register bit LONG_IDLE. DRAM core supply and refresh logic control 412 provides refresh rate 414 of 1× during active mode and 2× during long idle mode. DRAM core supply and refresh logic control 412 provides core supply management 416 of VCC during active mode and VCC/2 during long idle mode.

Figure 5:
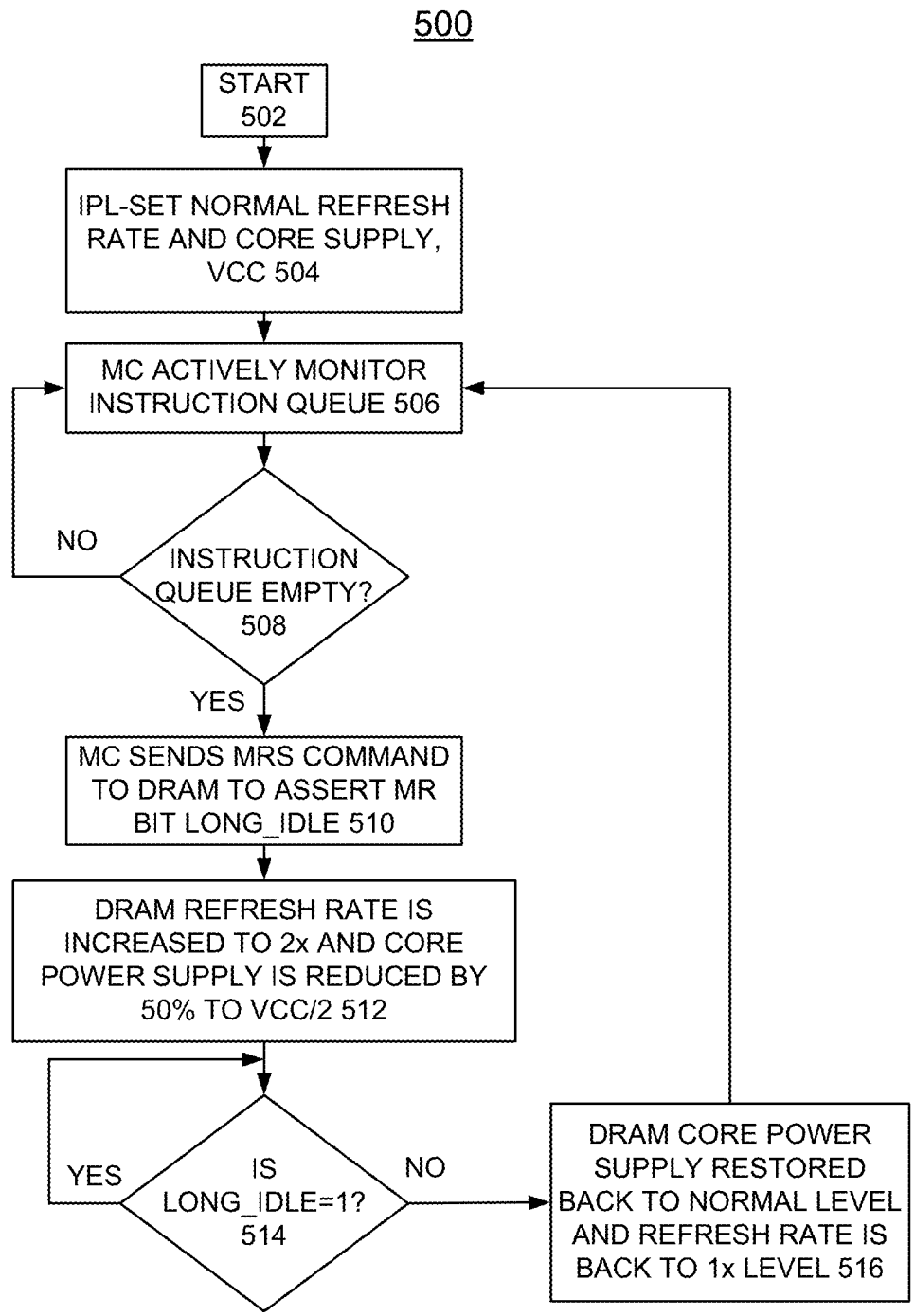
FIG. 5 is a flow chart illustrating example operations for implementing refresh power optimization during long idle mode in the memory subsystem of FIGS. 1 and 4 in accordance with preferred embodiments.

Referring to FIG. 5, there is shown flow chart illustrating example operations generally designated by the reference character 500 for implementing refresh power optimization during long idle mode in the memory subsystem 106, 400 in accordance with preferred embodiments starting at a block 502. During an initial program load (IPL), the normal refresh rate and core supply VCC are provided as indicated at a block 504. As indicated at a block 506, the memory controller (MC) actively monitors an instruction queue. Checking for an empty instruction queue is performed as indicated at a decision block 508. When an empty instruction queue is identified at decision block 508, the memory controller (MC) sends a mode register set (MRS) command DRAM to assert the predefined mode register bit LONG_IDLE as indicated at a block 510. As indicated at a block 512, the DRAM refresh rate is increased, for example to 2× and the core power supply is reduced by a selected value, such as by 50% to VCC/2. Checking for the mode register bit LONG_IDLE equal to 1 is performed as indicated at a decision block 514. When the mode register bit LONG_IDLE no longer is equal to 1, then the core power supply is increased by a selected value, such as by 50% to VCC and the DRAM refresh rate is decreased back to the 1× level as indicated at a block 516. Then the memory controller (MC) actively monitors an instruction queue at block 506.

Figure 6:
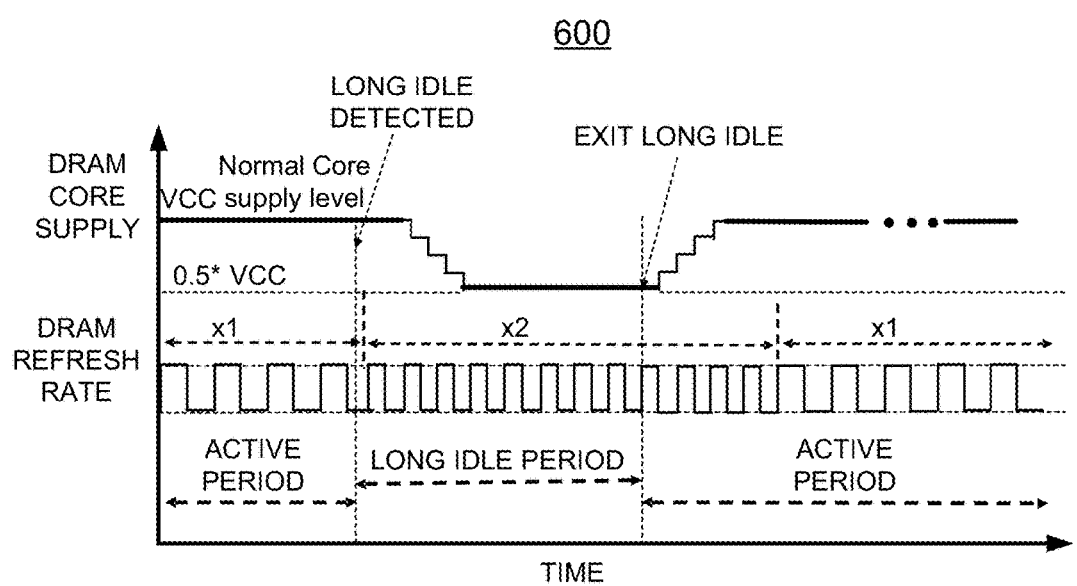
FIG. 6 is a timing diagram illustrating example operations for implementing refresh power optimization during long idle mode in the memory subsystem of FIGS. 1 and 4 in accordance with preferred embodiments.

Referring FIG. 6 there is shown a timing diagram illustrating example operations generally designated by the reference character 600 for implementing refresh power optimization during long idle mode in the memory subsystem 106, 400 and during active mode in accordance with preferred embodiments. The DRAM refresh rate is increased to 2× and the core power supply is reduced by a selected value, such as by 50% to VCC/2 during the long idle period after a long idle is detected. After the long idle is exited, then the core power supply is increased by a selected value, such as by 50% to VCC and the DRAM refresh rate is decreased back to the 1× level as shown during the active mode.

Referring to FIGS. 7, 8 and 9, there are shown respective example simulation and test characterization data generally designated by the reference characters 700, 800, and 900 including voltage and refresh rate values in the memory subsystem 106, 400 in accordance with preferred embodiments. Simulation test data 700 of FIG. 7 captures the DRAM cell charging current against DRAM core supply voltage and refresh rate. Data indicates as core supply voltage drops, refresh current, and hence power drops exponentially.

Referring FIG. 8, test characterization data 800 captures an example DDR4 DRAM power measurement for example, for 16 GB DDR4 Micron 20 nm 2R×8 IS RDIMM. The data strongly correlates with simulation data 700 shown in FIG. 7.

Referring FIG. 9, test characterization data 900 captures an example DDR4 DRAM power measurement for example, for 32 GB DDR4 Micron 20 nm. The data 900 strongly correlates with simulation data 700 shown in FIG. 7.

Test characterization data 800, 900 of FIGS. 8 and 9 show as DRAM capacity scales up (16 GB→32 GB), power consumption increases exponentially (almost 48% for a particular DRAM core supply and refresh rate). As DRAM core power supply reduces, DRAM refresh power reduces exponentially, potential scope for huge IDLE/STANDBY power reduction, for example, 44-52% power saving as DRAM core supply scales down from 1.2 v to 0.6 v). This is validated by simulation result using prototype model of DRAM array in 14 nm technology. As DRAM core supply reduces, refresh rate needs to be increased in order to support data retention at lower supply level. However, in spite of increasing refresh rate to say 2×, DRAM core still burns less refresh power (almost 44% less power as shown by simulation/test characterization data) at lower supply.

Figure 10:
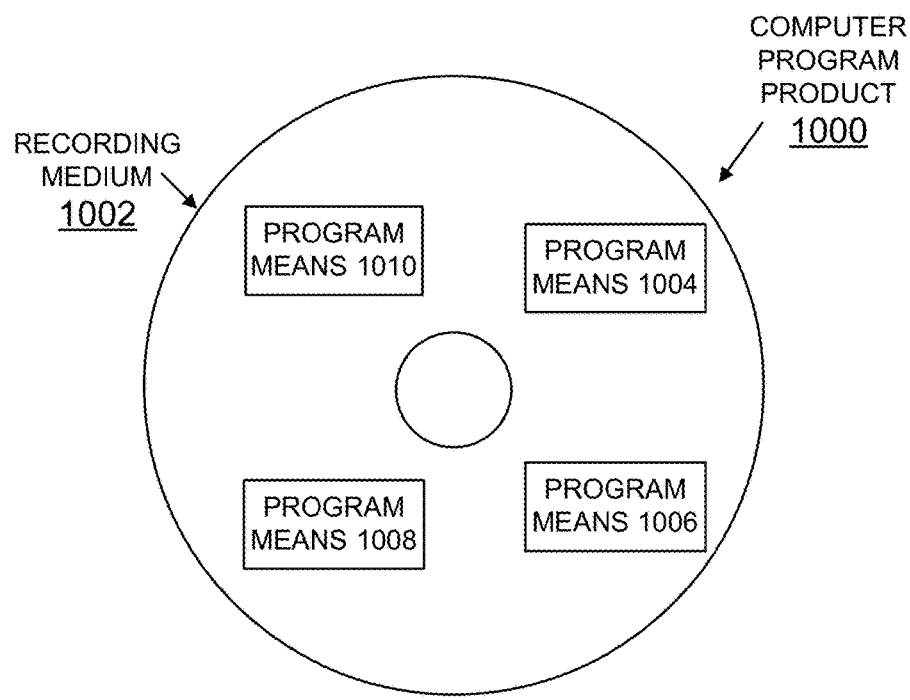
FIG. 10 is a block diagram illustrating a computer program product in accordance with the preferred embodiment.

Referring now to FIG. 10, an article of manufacture or a computer program product 1000 of the invention is illustrated. The computer program product 1000 is tangibly embodied on a non-transitory computer readable storage medium that includes a recording medium 1002, such as, a floppy disk, a high capacity read only memory in the form of an optically read compact disk or CD-ROM, a tape, or another similar computer program product. Recording medium 1002 stores program means 1004, 1006, 1008, and 1010 on the medium 1002 for carrying out the methods for implementing of FIGS. 1, 4, and 5.

A sequence of program instructions or a logical assembly of one or more interrelated modules defined by the recorded program means 1004, 1006, 1008, and 1010, direct the memory subsystem 400 for implementing refresh power optimization during long idle mode in the memory subsystem 106, 400 of the preferred embodiments.

While the present invention has been described with reference to the details of the embodiments of the invention shown in the drawing, these details are not intended to limit the scope of the invention as claimed in the appended claims.

What is claimed is:

1. A method for implementing refresh power optimization during long idle mode in a memory subsystem utilizing Dynamic Random Access Memory (DRAM) comprising:
   providing a DRAM includes DRAM cells requiring periodic refresh;
   providing a LONG IDLE mode register in the DRAM receiving a mode register set (MRS) command from a memory controller;
   providing a DRAM activity monitoring mechanism monitoring an instruction queue and asserting a predefined mode register bit when the instruction queue is empty; and
   responsive to the asserted predefined mode register bit, increasing a refresh rate and establishing a low power mode by reducing DRAM core power level for optimizing refresh power during the long idle mode to provide enhanced system performance.

2. The method as recited in claim 1 includes a memory controller sending the DRAM at least one mode register set (MRS) command when the instruction queue is empty.

3. The method as recited in claim 1 includes responsive to the assertion state of the predefined mode register bit, LONG_IDLE, a refresh control module inside the DRAM enhances the refresh rate including a refresh rate of two times (2×) a normal refresh rate.

4. The method as recited in claim 3 wherein providing the refresh rate of two times (2×) a normal refresh rate enhances charge retention capability of DRAM array cells at lower core supply.

5. The method as recited in claim 3 includes reducing a normal DRAM core power level (Vcc) by 50% to (Vcc/2) level.

6. The method as recited in claim 1 includes providing a DRAM core supply and refresh logic control to control a core supply management applied to the DRAM.

7. The method as recited in claim 1 includes providing a DRAM core supply and refresh logic control to control a refresh rate applied to the DRAM.

8. The method as recited in claim 1 includes sending a reset mode register set (MRS) command to the DRAM to disable the long idle mode.

9. A memory system for implementing refresh power optimization during long idle mode, the memory system utilizing Dynamic Random Access Memory (DRAM) comprising:
   a DRAM includes DRAM cells requiring periodic refresh;
   a memory controller, the memory controller for implementing refresh power optimization;
   a LONG IDLE mode register in the DRAM receiving a mode register set (MRS) command from the memory controller;
   the memory controller monitoring an instruction queue and asserting a predefined mode register bit when the instruction queue is empty; and
   the memory controller responsive to the asserted predefined mode register bit, increasing a refresh rate and establishing a low power mode by reducing DRAM core power level for optimizing refresh power during the long idle mode to provide enhanced system performance.

10. The memory system as recited in claim 9, includes control code stored on a computer readable medium, and wherein the memory controller uses the control code to implement refresh power optimization.

11. The memory system as recited in claim 9 includes the memory controller sending the DRAM at least one mode register set (MRS) command when the instruction queue is empty.

12. The system as recited in claim 9 includes a DRAM core supply and refresh logic control in the DRAM responsive to the assertion state of predefined mode register bit LONG_IDLE, enhances the refresh rate including a refresh rate of two times (2×) a normal refresh rate.

13. The system as recited in claim 9 includes a DRAM core supply and refresh logic control in the DRAM providing core supply management applied to the DRAM.

14. The system as recited in claim 13 includes the DRAM core supply and refresh logic control actuates a low power mode by reducing normal DRAM core power level (Vcc) to a long idle level (Vcc/2).

15. The system as recited in claim 9 includes the LONG_IDLE mode register applying a control LONG_IDLE mode register bit to a DRAM core supply and refresh logic control in the DRAM responsive to the MRS command from the memory controller.

16. The system as recited in claim 15 includes the DRAM power management and refresh control module monitoring continuously DRAM idle status of the LONG_IDLE mode register bit.

17. The system as recited in claim 15 includes the DRAM power management and refresh control module exiting the long idle state, restoring normal power supply level (Vcc) and restoring refresh rate to normal (1×) level.

18. A memory system for implementing refresh power optimization during long idle mode, the memory system utilizing Dynamic Random Access Memory (DRAM) comprising:
   a DRAM includes DRAM cells requiring periodic refresh;
   a memory controller, the memory controller for implementing refresh power optimization;
   the memory controller monitoring an instruction queue and asserting a predefined mode register bit when the instruction queue is empty;
   the memory controller responsive to the asserted predefined mode register bit, increasing a refresh rate and establishing a low power mode by reducing DRAM core power level for optimizing refresh power during the long idle mode to provide enhanced system performance; and
   the memory controller sending a reset mode register set (MRS) command to the DRAM to disable the long idle mode.

* * * * *